United States Patent
Mahnkopf et al.

(10) Patent No.: US 7,058,095 B2
(45) Date of Patent: Jun. 6, 2006

(54) TUNABLE SEMICONDUCTOR LASER AND PRODUCTION METHOD

(75) Inventors: Sven Mahnkopf, Randersacker (DE); Reinhard März, München (DE)

(73) Assignee: Infineon Technologies AG, Munich (DE)

( * ) Notice: Subject to any disclaimer, the term of this patent is extended or adjusted under 35 U.S.C. 154(b) by 312 days.

(21) Appl. No.: 10/722,025

(22) Filed: Nov. 25, 2003

(65) Prior Publication Data
US 2004/0125832 A1 Jul. 1, 2004

(30) Foreign Application Priority Data
Nov. 25, 2002 (DE) ............................... 102 54 909

(51) Int. Cl.
*H01S 3/10* (2006.01)
(52) U.S. Cl. .......................... 372/20; 372/98; 372/102
(58) Field of Classification Search ................. 372/20, 372/98
See application file for complete search history.

(56) References Cited

U.S. PATENT DOCUMENTS

| 4,896,325 A | 1/1990 | Coldren |
| 5,365,541 A | 11/1994 | Bullock |
| 5,684,817 A * | 11/1997 | Houdre et al. ........... 372/45.01 |
| 6,141,370 A | 10/2000 | Avrutsky et al. |
| 6,597,721 B1 * | 7/2003 | Hutchinson et al. .......... 372/98 |

FOREIGN PATENT DOCUMENTS

WO      94/16345      7/1994

* cited by examiner

*Primary Examiner*—Minsun Oh Harvey
*Assistant Examiner*—Dung Nguyen
(74) *Attorney, Agent, or Firm*—Laurence A. Greenberg; Werner H. Stemer; Ralph E. Locher

(57) ABSTRACT

A resonator structure containing an active layer is subdivided into at least two sections in which mode spacings differ from one another by 7 to 10 percent on account of different length dimensions or as a result of grating structures provided therefor. Photonic crystals are integrated as longitudinal and, if appropriate, as lateral boundaries of the resonator structure. Variation of the currents in the sections enables the laser to be tuned in a wide wavelength range.

8 Claims, 3 Drawing Sheets

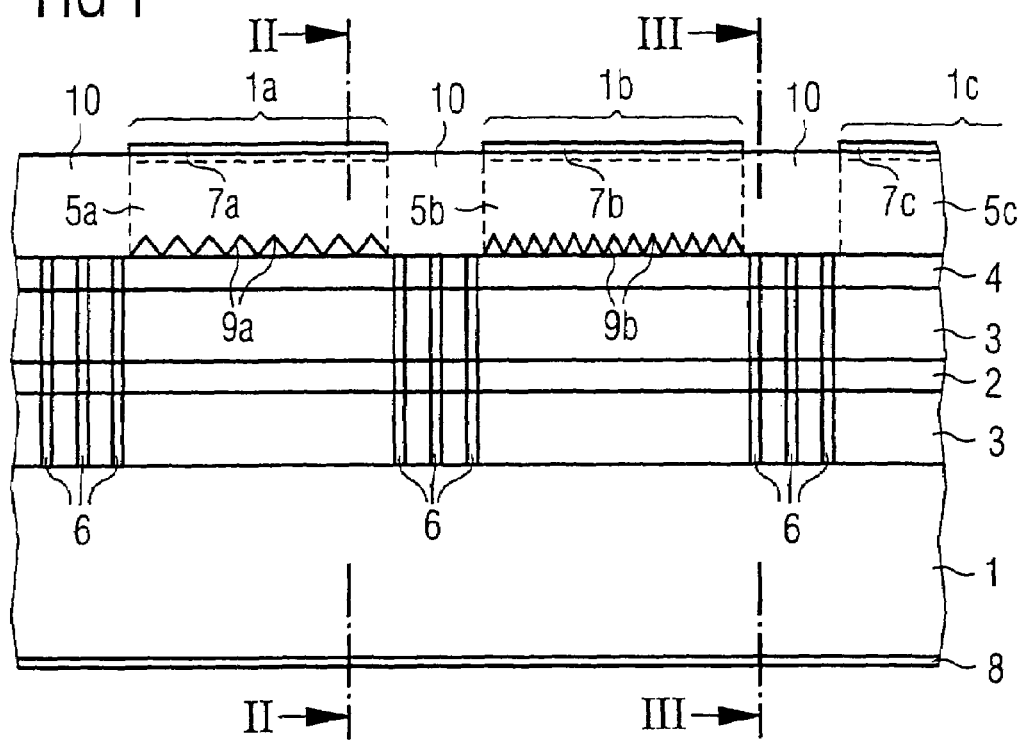
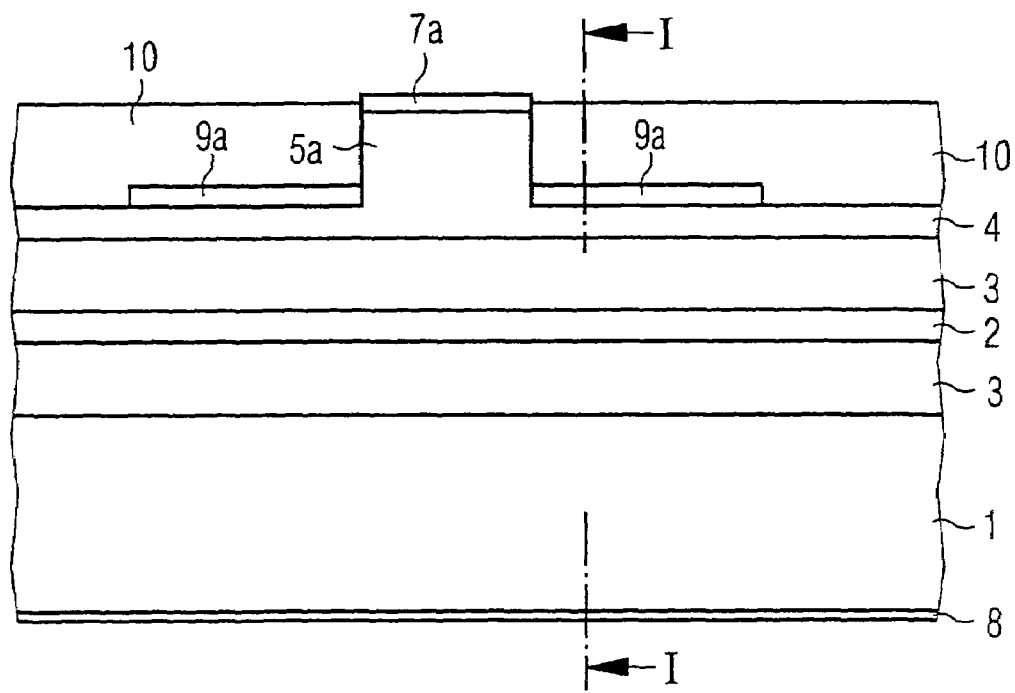

TUNABLE SEMICONDUCTOR LASER AND PRODUCTION METHOD

BACKGROUND OF THE INVENTION

Field of the Invention

The present invention relates to a tunable semiconductor laser having an active layer structure that is subdivided into at least two sections.

U.S. Pat. No. 4,896,325 describes a tunable semiconductor laser with a subdivision of the resonator structure into a plurality of sections. Mirrors at the resonator end faces are formed with a plurality of elements in the manner of a Fabry-Perot interferometer and can be set to different reflection maxima by application of suitable voltages. A further section of the resonator that is provided for achieving a high laser gain and a further section that is provided as a phase shifter are likewise driven by suitable voltages.

U.S. Pat. No. 5,365,541 describes the use of a photonic crystal as a resonator end mirror of a laser. The function of the photonic crystals is also explained in more detail in column 5 of this document. In accordance with the formation of valence and conduction bands in solids with a lattice-like periodic configuration of the atoms, periodically varying regions of alternating refractive index are present in photonic crystals. As a result, for the radiation propagating in the photonic crystal, by analogy with the solid state, band gaps in the wavelength are produced in which wave-guiding is not possible. Such photonic crystals can therefore be used as mirrors for the relevant wavelength ranges.

U.S. Pat. No. 5,684,817 describes a semiconductor laser in which regions of photonic crystals that form respective resonator end mirrors of an active laser structure are integrated in the component.

International Patent Disclosure WO 94/16345 describes an integrated optoelectronic component in which wave guidance is brought about by photonic crystals. The photonic crystals are integrated into the component by filling cylindrical regions with dielectric material.

U.S. Pat. No. 6,141,370 describes a binary superimposed grating (BSG), in which regions of identical length and in each case one of two possible values of the refractive index are present. The regions alternate in a periodic sequence, a likewise periodic phase shift being superimposed. Attention is drawn to applications of such BSGs in tunable semiconductor lasers.

SUMMARY OF THE INVENTION

It is accordingly an object of the invention to provide a tunable semiconductor laser and a production method that overcome the above-mentioned disadvantages of the prior art devices and methods of this general type, that can be produced more simply.

With the foregoing and other objects in view there is provided, in accordance with the invention, a tunable semiconductor laser. The tunable semiconductor laser contains a resonator structure being subdivided longitudinally into at least two sections. The resonator structure has longitudinal ends, an active layer generating radiation, and resonator end mirrors and/or gratings for bringing about an occurrence of an envisaged number of discrete modes in the sections. The discrete modes have spacings from one another and differ in the two sections of the resonator structure. A device for providing separate current injection into the active layer is provided in at least two of the sections. Photonic crystals are disposed at least at the longitudinal ends of the resonator structure. The photonic crystals have, as a band gap in which no wave-guiding takes place, a wavelength range in which a principal wavelength of the tunable semiconductor laser lies or a maximum gain of the tunable semiconductor laser occurs.

The semiconductor laser has an active layer in a resonator structure with a longitudinal direction that is provided for wave-guiding and mode selection. A transverse wave guidance is preferably effected by index guidance in a separate confinement heterostructure (SCH), and a lateral wave guidance is preferably effected by a rib waveguide, which is known per se. The resonator structure contains resonator end mirrors at the longitudinal ends and/or at least one grating, thereby achieving the occurrence of an envisaged number of discrete modes.

The resonator structure is subdivided into at least two sections provided with contacts disposed at the component, for current injection, preferably into each section separately. By virtue of different dimensions in the longitudinal direction or by virtue of the formation of the grating structures disposed thereon, these sections are formed in such a way that the spacings of the modes that respectively occur therein in the sections are different from one another.

Boundaries formed of photonic crystals are disposed at least at the outer longitudinal ends of the resonator structure, preferably at all the longitudinal ends of the sections. The wavelength range of the band gap of the photonic crystals contains a range of maximum gain of the laser or contains a principal wavelength of the laser; the principal laser wavelength preferably lies about in the center of the band gap of the photonic crystals. The deviation of the mode spacings in the sections may be produced by the different length of the sections between the respective boundaries by photonic crystals or by grating structures. BSGs are preferably used as the gratings.

In accordance with an added feature of the invention, the spacings of the discrete modes differ in at least two of the sections of the resonator structure at least by about a half-value width of the discrete modes.

In accordance with a further feature of the invention, the two sections are two of a plurality of the sections having different mode spacings.

In accordance with an additional feature of the invention, the sections of the resonator structure have different longitudinal dimensions.

In accordance with another feature of the invention, at least one of the sections of the resonator structure is provided with a grating provided for mode selection. Preferably, the grating is a binary superimposed grating.

In accordance with another further feature of the invention, the spacings are in a range of 3 nm to 10 nm.

With the foregoing and other objects in view there is further provided, in accordance with the invention, a method for producing a semiconductor laser. The method includes growing and doping a semiconductor layer structure having confinement layers and at least one active layer for generating radiation disposed between the confinement layers, etching partial webs into the semiconductor layer structure using a mask, applying and patterning an additional further mask layer using a photoresist mask in accordance with photonic crystals to be produced and resulting in a patterned mask layer, etching holes into the semiconductor layer structure using the patterned mask layer, removing the patterned mask layer, and applying a further mask which leaves free regions provided for gratings to be produced. A metal layer is deposited and patterned to form at least one grating in the free regions. A dielectric material is applied for filling the holes provided for the photonic crystals. Contacts are applied to the semiconductor layer structure.

Other features which are considered as characteristic for the invention are set forth in the appended claims.

Although the invention is illustrated and described herein as embodied in a tunable semiconductor laser and a production method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

FIG. 1 is a diagrammatic, longitudinal sectional view of a tunable semiconductor laser with gratings according to the invention;

FIG. 2 is a cross-sectional view of the semiconductor laser taken along the line II—II shown in FIG. 1;

DESCRIPTION OF THE PREFERRED EMBODIMENTS

Figure 3:
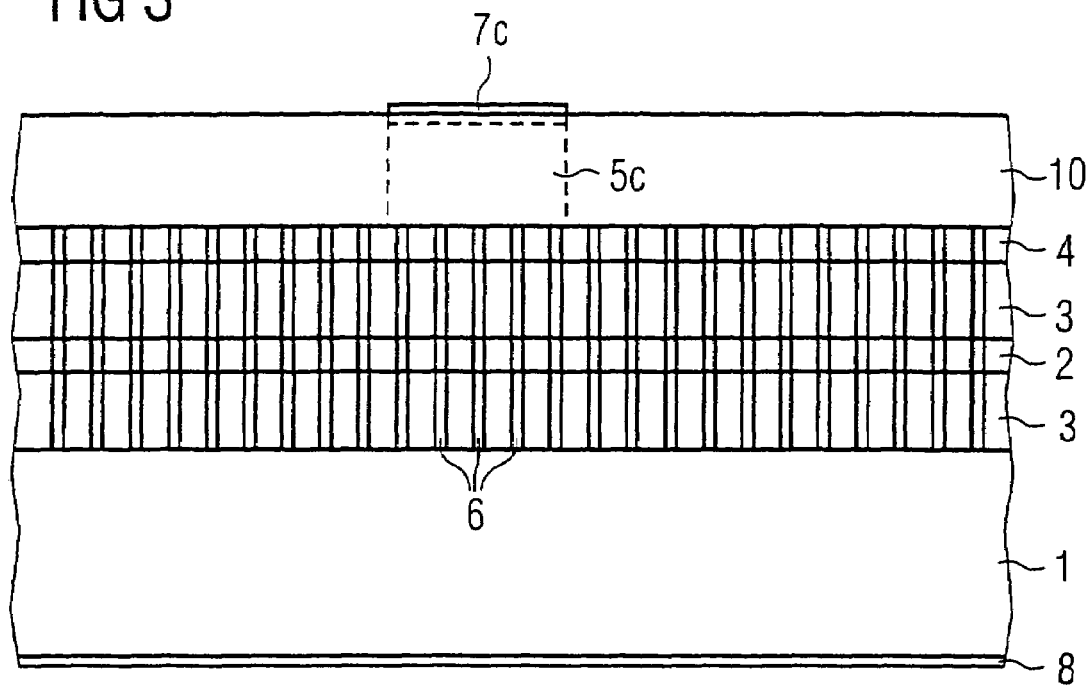
FIG. 3 is a cross-sectional view of the semiconductor laser taken along the line III—III shown in FIG. 1.

Referring now to the figures of the drawing in detail and first, particularly, to FIG. 1 thereof, there is shown a first exemplary embodiment in a longitudinal section, that is to say in a cross section of the component in the longitudinal direction of a resonator structure. The layer structure may be grown on a substrate 1 e.g. by molecular beam epitaxy in a material system of InGaAsP. The resonator structure is subdivided into at least two sections each having a length of 400 µm for example. The number of the sections is not defined. Three sections 1a, 1b, 1c are depicted in the exemplary embodiment illustrated in FIGS. 1 to 4.

Confinement layers 3 for transverse wave guidance are situated above and below an active layer 2 provided for generating radiation. It is also possible to provide separate layers for optical and electrical confinement. The layers above and below the active layer 2 are doped, for the purpose of current injection, and for electrical conduction of mutually opposite conductivity types. A cladding layer or covering layer 4 made of a semiconductor material is patterned into a web on the top side which is interrupted in the longitudinal direction, thereby forming partial webs 5a, 5b, 5c assigned to the sections 1a, 1b, 1c.

Photonic crystals 6 are provided as the resonator end mirrors and as boundaries for the partial resonator structures in accordance with the sections 1a, 1b, 1c. It suffices if the photonic crystals 6 are bounded to the layer position of the active layer 2 in the transverse direction; however, the photonic crystals 6 are preferably produced only after the growth of all the semiconductor layers and then encompass, as depicted, the confinement layers 3 and the covering layer 4 as well.

Contacts 7a, 7b, 7c for separate current injection into at least two of the sections 1a, 1b are situated on the topside of the partial webs 5a, 5b, so that the laser can be operated and tuned. A further contact 8 is situated on the underside of the substrate 1. Instead of this, the contact 8 may be disposed on the topside of the component laterally with respect to the strip-type resonator structure and be electrically conductively connected to the underside of the active layer 2 via doped regions formed in the semiconductor material.

Gratings 9a, 9b provided in the exemplary embodiment are preferably disposed laterally with respect to the partial webs 5a, 5b and may be produced as BSGs by electron beam lithography. The gratings 9a, 9b are preferably just as long as the associated sections 1a, 1b of the resonator structure. The gratings 9a, 9b are configured e.g. in such a way that a predetermined number of reflection maxima, for example ten, are formed in each section 1a, 1b, a central mode lying in the region of the gain maximum of the semiconductor material of the active layer 2 and mode spacings being chosen in relation to the number of modes such that monomode nature is achieved. Furthermore, the spacings of the modes in the sections must differ at least by about the half-value width of the modes, that is to say the reflection peaks.

In a preferred exemplary embodiment with in each case about ten modes, that is the case with mode spacings in the range of 3 nm to 10 nm, typically about 5 nm, which differ in the two sections preferably by about 7 to 10%. The tuning may be performed through suitable variation of the currents injected into the sections, both (quasi) continuously and with inclusion of mode jumps. A plurality of sections with different mode spacings may also be present.

The reflector end mirror is formed with the best possible reflection, that is to say with a reflection factor of close to 1, by the photonic crystals 6 being disposed there in highly reflective fashion. The other reflector end mirror provided for radiation emergence may be split for the purpose of coupling out light, which is known per se. The topside of the component may be leveled with a planarization layer 10, e.g. made of BCB. The contours of the partial webs 5a, 5b, 5c are therefore depicted by broken lines as contours concealed by the planarization layer 10 in FIG. 1. The laser is tuned through suitable variations of the currents injected into the sections.

FIG. 2 shows the cross section through the partial web 5a that is specified by a dash-dotted line in FIG. 1. The reference symbols correspond to those of FIG. 1 and need not be explained separately. FIG. 2 reveals, in particular, that the gratings 9a are disposed laterally with respect to the web. No photonic crystals 6 need be present in this region of the laser. The position of the cross section of FIG. 1 is indicated by the dash-dotted line in FIG. 2.

FIG. 3 illustrates a cross section that is coplanar with respect to the cross section in accordance with FIG. 2 in the region between two partial webs 5b, 5c whose position is likewise marked in FIG. 1. In this example, the photonic crystals 6 are also present in the lateral regions—with respect to the web—between the partial webs. The nearest partial web 5c in the viewing direction is depicted for orientation purposes, to be precise by broken lines as a contour concealed by the planarization layer 10.

Figure 4:
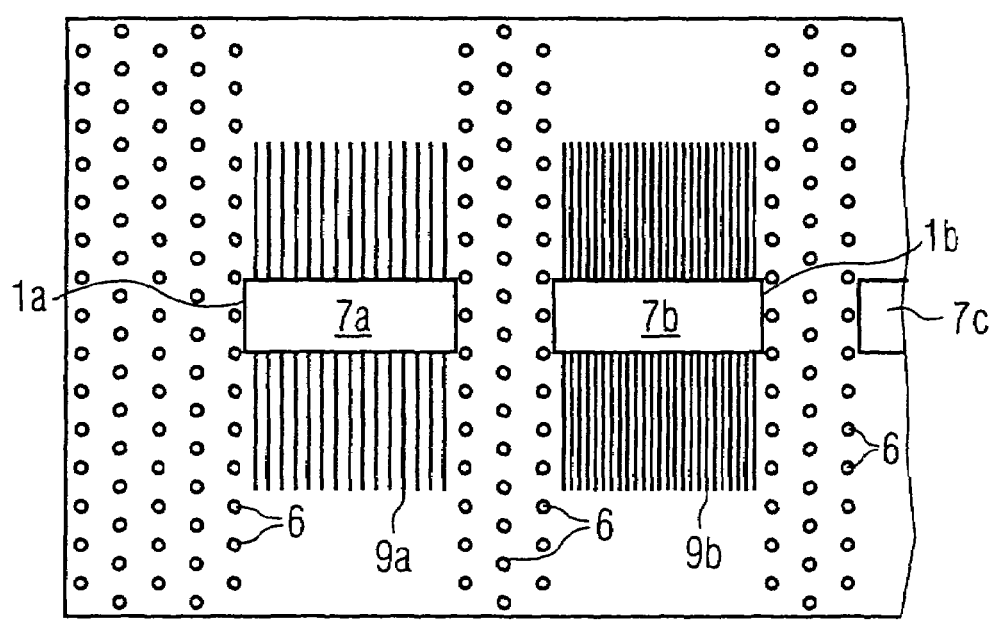
FIG. 4 is a diagrammatic, plan view of a resonator structure of the semiconductor laser of FIG. 1.

The plan view of FIG. 4 reveals the sections 1a, 1b, 1c with the contacts 7a, 7b, 7c, which in each case completely cover the top sides of the partial webs 5a, 5b, 5c in this example. The structure of the gratings 9a, 9b and of the photonic crystals 6 is depicted diagrammatically. It can be seen that the photonic crystals 6 usually form a hexagonal grid. The break line depicted on the right may be followed by further integrated electronic or optoelectronic components. The third partial web 5c may be configured in bent fashion toward a coupling-out region for the purpose of better coupling-out of light. The third partial web 5c may also be provided as an amplifier, for example, which is operated by the contacts 7c and 8.

Not all the sections need be provided with a respective grating. The resonator structure may have two or more sections that are different from one another in each case by virtue of the length and/or grating structures provided.

The structure illustrated in FIGS. 1 to 4 may be produced by a procedure in which first the semiconductor layers are grown over the whole area and are doped in the envisaged manner.

The partial webs are etched using a mask. A mask layer, preferably an $SiO_2$ layer, is applied and patterned with a photoresist mask in accordance with the photonic crystals to be produced. The photoresist is removed. At the regular intervals provided for the photonic crystals 6, holes are etched into the semiconductor material, preferably right into the lower confinement layer 3, using the patterned mask layer. The material of the mask layer is removed.

Using a further photoresist mask, which leaves free the regions provided for the coatings, a metal layer is deposited and patterned, thereby producing, in particular, a respective BSG. After the removal of the photoresist, a dielectric material, preferably BCB, is applied by which the holes provided for the photonic crystals are filled and the topside is planarized. Finally, the contacts are applied.

Figure 5:
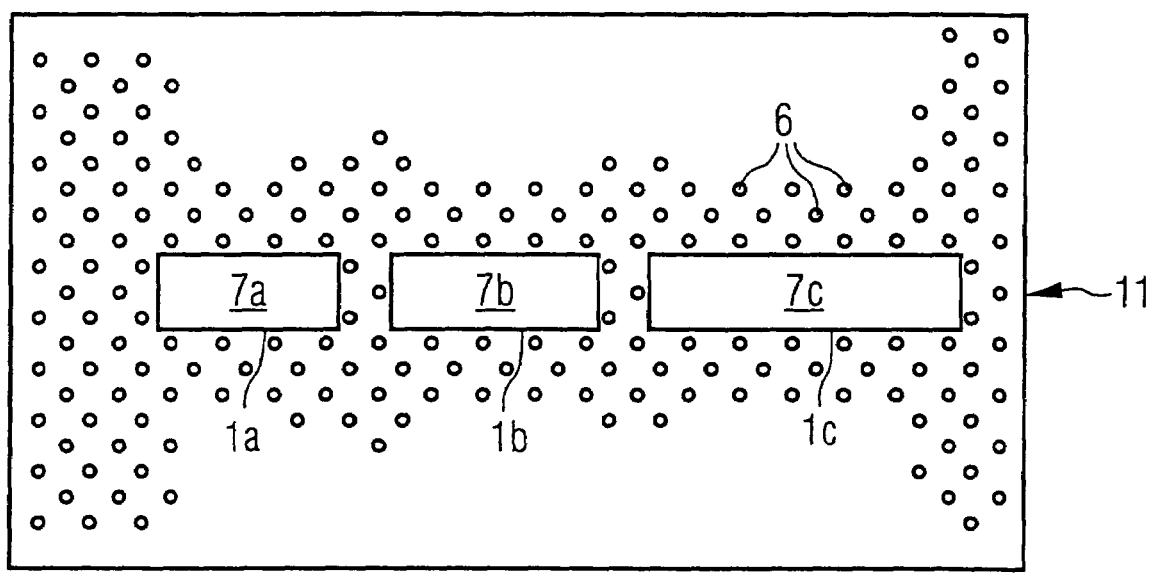
FIG. 5 is a diagrammatic, plan view of the resonator structure of a further exemplary embodiment.

A further exemplary embodiment dispenses with the gratings, so that the resonator structure is formed solely by the reflective boundaries of the photonic crystals 6. FIG. 5 illustrates a diagrammatic plan view of such a resonator structure in which the sections 1a, 1b, 1c are formed. The sections 1a, 1b, 1c are bounded laterally and longitudinally by photonic crystals 6 which bring about not only the longitudinal section but also the lateral wave guidance.

The lengths of the sections 1a, 1b, 1c are chosen to be different, so that the mode spacings in the sections are different, preferably at least by about the half-value width of the modes, that is to say the reflection peaks. On account of the amplifying property of the semiconductor material of the active layer, it is possible to set an envisaged number of modes. In order to achieve monomode nature the mode spacings and the numbers of modes are coordinated with one another. In this exemplary embodiment, too, the mode spacings in the sections may differ by about 7 to 10% and are typically in the range of 3 nm to 10 nm.

In the exemplary embodiment, coarse tuning of the laser is effected through a suitable variation of the currents injected into the sections; fine tuning is possible by varying the temperature. In this example, a coupling-out region 11 is situated at an end of the resonator structure at which the boundary by photonic crystals 6 is sufficiently thin to enable light emergence. In this exemplary embodiment, too, further integrated electronic or optoelectronic components may be present. The last section 1c of the resonator structure that is provided for the purpose of coupling out light can in this case likewise be led in bent fashion to the edge of the component. The number of sections is not defined; two sections in which the mode spacings differ in the envisaged manner suffice for the tunability of the laser.

Compared with previous configurations of tunable semiconductor lasers, the solution according to the invention affords the advantage that the photonic crystals 6 can be produced in a simple manner by standard lithography methods and the reflectivities and coupling intensities of the sections of the resonator structure can thus be set without a high outlay. The high index jumps that can be realized by the photonic crystals make it possible to produce novel resonator geometries that are not possible in the conventional art.

We claim:

1. A tunable semiconductor laser, comprising:
   a resonator structure being subdivided longitudinally into at least two sections, said resonator structure, containing:
   longitudinal ends;
   an active layer generating radiation;
   at least one of resonator end mirrors and gratings for bringing about an occurrence of an envisaged number of discrete modes in said sections, said discrete modes have spacings from one another and differ in said two sections of said resonator structure; and
   a device for providing separate current injection into said active layer and provided in at least two of said sections; and
   photonic crystals disposed at least at said longitudinal ends of said resonator structure, said photonic crystals having, as a band gap in which no wave-guiding takes place, a wavelength range in which a principal wavelength of the tunable semiconductor laser lies or a maximum gain of the tunable semiconductor laser occurs.

2. The tunable semiconductor laser according to claim 1, wherein the spacings of said discrete modes differ in at least two of said sections of said resonator structure at least by about a half-value width of said discrete modes.

3. The tunable semiconductor laser according to claim 1, wherein said two sections are two of a plurality of said sections having different mode spacings.

4. The tunable semiconductor laser according to claim 1, wherein said sections of said resonator structure have different longitudinal dimensions.

5. The tunable semiconductor laser according to claim 1, wherein at least one of said sections of said resonator structure is provided with a grating provided for mode selection.

6. The tunable semiconductor laser according to claim 5, wherein said grating is a binary superimposed grating.

7. The tunable semiconductor laser according to claim 1, wherein the spacings are in a range of 3 nm to 10 nm.

8. A method for producing the semiconductor laser according to claim 1.

* * * * *